United States Patent [19]
Noble

[11] Patent Number: 6,156,589
[45] Date of Patent: Dec. 5, 2000

[54] COMPACT SOI BODY CONTACT LINK

[75] Inventor: Wendell P. Noble, Milton, Vt.

[73] Assignee: Micron Technology, Inc., Boise, Id.

[21] Appl. No.: 09/146,301

[22] Filed: Sep. 3, 1998

[51] Int. Cl.$^7$ .................................................. H01L 21/00
[52] U.S. Cl. ........................................... 438/149; 438/149
[58] Field of Search ..................................... 438/280, 295, 438/233, 219, 218, 211, 201, 164, 149, 268, 269, 167, 179

[56] References Cited

U.S. PATENT DOCUMENTS

| | | | |
|---|---|---|---|
| 5,587,604 | 12/1996 | Machesney et al. ..................... | 257/350 |
| 5,691,230 | 11/1997 | Forbes ........................................ | 437/62 |
| 5,909,618 | 5/1999 | Forbes et al. ............................. | 438/242 |
| 5,930,605 | 7/1999 | Mistry et al. ............................. | 438/149 |
| 6,020,239 | 1/2000 | Gambino et al. ......................... | 438/269 |

*Primary Examiner*—David Nelms
*Assistant Examiner*—Dung A Le
*Attorney, Agent, or Firm*—Schwegman, Lundberg, Woessner & Kluth, P.A.

[57] ABSTRACT

A method and structure for a silicon on insulator (SOI) device with a body contact are provided. The body contact is formed by epitaxial growth from a substrate to the body region of the device. The body contact is self-aligned with the gate of the device and is buried within an isolation region outside of the active area of the device. Thus, the body contact does not increase parasitic capacitance in the device, not does the body contact affect device density. No additional metal wiring or contact holes are required.

12 Claims, 6 Drawing Sheets

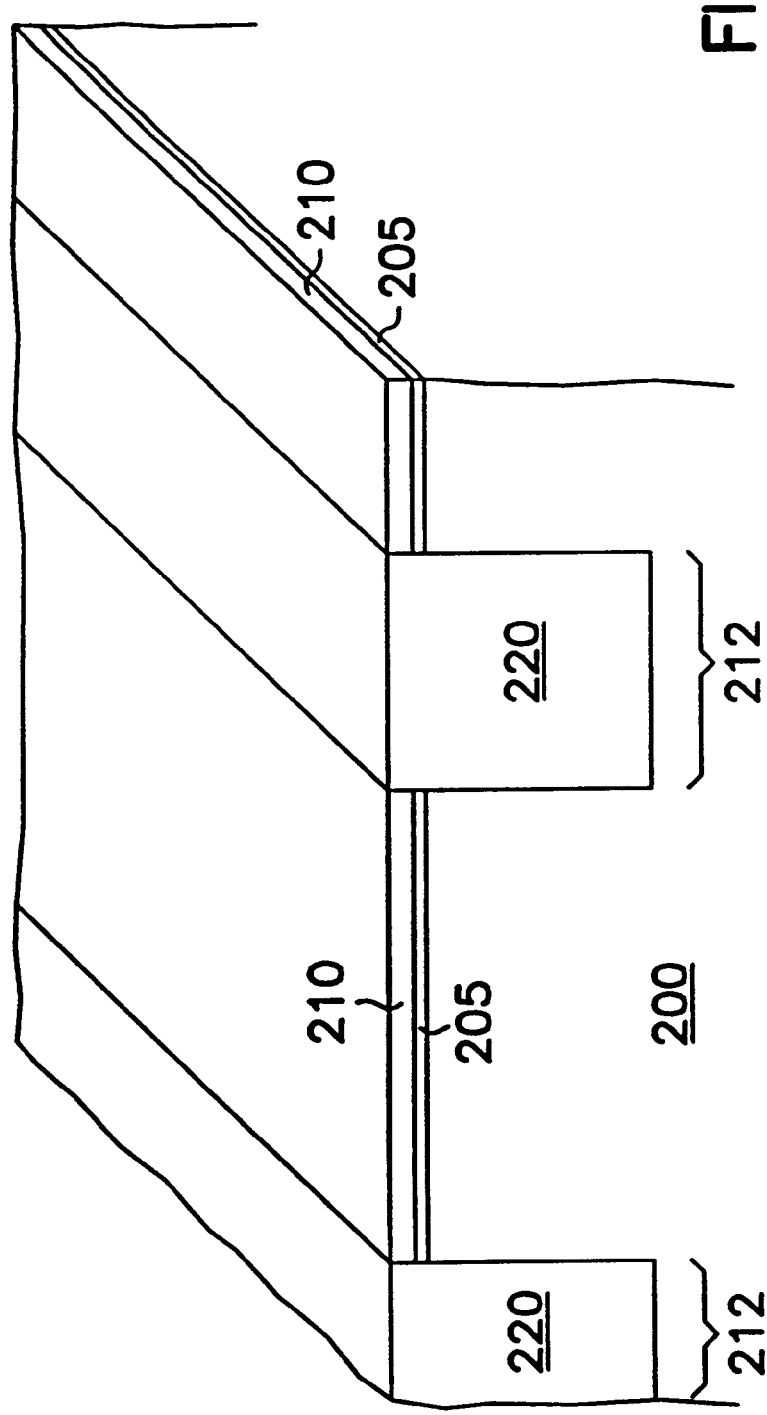

COMPACT SOI BODY CONTACT LINK

FIELD OF THE INVENTION

The present invention relates generally to semiconductor integrated circuits. More particularly, it pertains to a method and structure for a silicon on insulator (SOI) device body contact.

BACKGROUND OF THE INVENTION

Integrated circuit technology relies on transistors to formulate vast arrays of functional circuits. The complexity of these circuits requires the use of an ever increasing number of linked transistors. As the number of transistors required increases, the surface area that can be dedicated to a single transistor dwindles. It is desirable then, to construct transistors which occupy less surface area on the silicon chip/die.

In one example, integrated circuit technology uses transistors conjunctively with Boolean algebra to create a myriad of digital circuits, also referred to as logic circuits. In a typical arrangement, transistors are combined to switch or alternate an output voltage between just two significant voltage levels, labeled logic 0 and logic 1. In an alternate example, integrated circuit technology similarly uses transistors combined with capacitors to form memory cells. Here, the data is stored in electronic form as a charge on the capacitor. The charge, or absence of charge, on the capacitor translates to either a logic 1 or 0. Most logic systems use positive logic, in which logic 0 is represented by zero volts, or a low voltage, e.g., below 0.5 V; and logic 1 is represented by a higher voltage.

Integrated circuits, including transistors, are typically formed from either bulk silicon starting material, silicon on insulator (SOI) starting material, or SOI material that is formed from a bulk semiconductor starting material during processing. The SOI complementary metal oxide semiconductor (CMOS) technology, however, has been viewed as a likely successor to conventional bulk technology since it provides a prospect of greater circuit performance. This increase in performance results from the lower parasitic junction capacitances and the improved transistor characteristics and tolerances. Basic to the feature of isolating the active silicon layer from the substrate by an intervening insulator layer is the so called "floating body" effect on device characteristics. Since the bodies of individual devices are not in direct electrical contact to the conducting substrate, their electrical potential can vary with time depending on leakage currents and parasitic capacitive coupling to other electrodes. Such an effect is clearly undesirable and represents a major stumbling block to the introduction of SOI as a viable product technology.

One approach to handle the uncertain body potential is to include margins within the circuit design to allow for the floating body effect. While this requires no technology action, it diminishes the performance benefits of SOI. Another approach is to minimize the floating body effect by providing an enhanced leakage path to the device body from the device source. This is a partial solution since it merely limits the amount by which the body potential may vary relative to the source and does not allow the voltage to be set at any particular optimum value. Further, it necessarily creates an electrically asymmetric device which limits its acceptability. Other techniques include providing a separate conducting contact to the device bodies. To date, however, the methods proposed have proven cumbersome and come at the price of decreased device density or a compromise in the lower parasitic junction capacitance that motivates the use of SOI.

Thus what is needed is an improved method and structure for implementing SOI transistors, or devices, which provide a predictable electrical potential in the body of the device without sacrificing the benefits attained from using the SOI structure. Any improved method and structure should also conserve surface space on the semiconductor die and maximize device density.

SUMMARY OF THE INVENTION

The above mentioned problems with silicon on insulator (SOI) devices and other problems are addressed by the present invention and will be understood by reading and studying the following specification. A method and structure are provided which accord improved performance for such devices.

In particular, an illustrative embodiment of the present invention includes a silicon on insulator (SOI) device on a substrate. The device includes a single crystalline semiconductor structure which has a first source/drain region, a body region, and a second source/drain region. A gate is formed on a gate oxide which is located above the body region. An insulator layer separates the single crystalline semiconductor structure from the substrate. Further, a body contact is self-aligned with the gate and couples the substrate to a portion of the body region.

In another embodiment, a body contacted transistor on an insulator layer is provided. The transistor includes an active region. The active region has a first source/drain region, a second source/drain region, and a body region. A gate is located above the body region and between the first and second source/drain region. A body contact is coupled to a substrate in an isolation region. The body contact is further coupled to the body region.

In another embodiment, a silicon on insulator (SOI) device is provided. The device includes a substrate. An insulator layer is formed on the substrate. The device includes a planar semiconductor structure which has an upper surface and opposing sidewalls. The planar semiconductor structure also includes a first source/drain region, a body region, a second source/drain region, and a gate. The planar semiconductor structure is formed on the insulator layer. A conductive sidewall member is included in the device. The conductive sidewall member is self-aligned with the gate and couples the substrate to one of opposing sidewalls.

In another embodiment, a method of fabricating a silicon on insulator (SOI) device is provided. The method includes forming a single crystalline semiconductor structure which has an upper surface. The structure is formed to include a first source/drain region, a body region with opposing sidewalls, and a second source/drain region. The structure is formed on an insulator layer on a substrate. A gate is formed on the single crystalline semiconductor structure. The gate is formed such that it extends beyond portions of the single crystalline semiconductor structure to cover portions of an isolation region. A body contact is formed self-aligned with the gate and couples the substrate to one of the opposing sidewalls of the body region.

In another embodiment, a method of forming a body contacted transistor on an insulator layer is provided. The method includes forming an active region of the transistor. The active region is formed to include a first source/drain region, a second source/drain region, and a body region. A gate is formed above the body region and between the first and second source/drain region. A body contact is formed to which couples to a substrate in an isolation region. The body contact is formed such that it additionally couples to the body region.

Thus, a method and structure for an improved silicon on insulator (SOI) device are provided. The method and structure include a body contact that is formed from epitaxial growth from the substrate to the body region of the device. The body contact is self-aligned with the gate in an isolation region of the device and therefore does not increase parasitic capacitance in the device. The structure conserves surface space on the semiconductor die and maximizes device density while preserving the performance benefits of the SOI structure.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIGS. 2A–2I illustrate an embodiment of the various processing steps for fabricating the silicon on insulator device.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term "horizontal" as used in this application is defined as a plane substantially parallel to the conventional plane or surface of a wafer or substrate, regardless of the orientation of the wafer or substrate. The term "vertical" refers to a direction substantially perpendicular to the horizonal as defined above. Prepositions, such as "on," "upper," "side" (as in "sidewall"), "higher," "lower," "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n and p-type semiconductor materials, respectively.

Figure 1A:
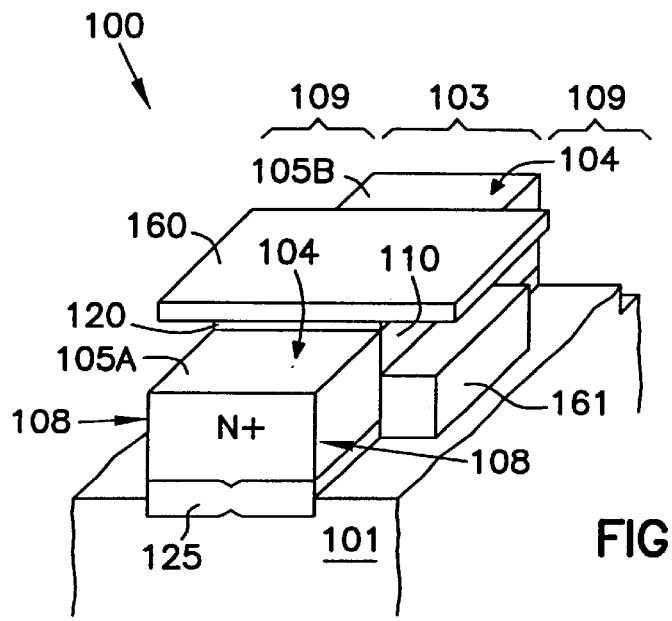
FIG. 1A is a perspective view of an embodiment of the silicon on insulator (SOI) device according to the teachings of the present invention.

FIG. 1A is a perspective view illustrating one embodiment of a silicon on insulator (SOI) device 100, according to the teachings of the present invention. The SOI device 100 includes a body contacted transistor on an insulator layer. FIG. 1A illustrates that the SOI device 100 has a single crystalline semiconductor structure 103. The single crystalline semiconductor structure 103 has an upper surface 104 and opposing sidewalls 108 and forms a planar semiconductor structure. The single crystalline semiconductor structure 103 has a first source/drain region 105A, a body region 110, and a second source/drain region 105B. The single crystalline semiconductor structure 103 defines the "active region" of the device. Portions exterior to the active region constitute "isolation regions" 109. The isolation regions 109 surround the active region of the single crystalline semiconductor structure 103. A gate 160 is located above the single crystalline semiconductor structure 103 between the first and second source/drain regions, 105A and 105B respectively. The gate 160 is separated from the body region 110 by a gate oxide 120. The single crystalline semiconductor structure is formed on an insulator layer 125 which is formed on a substrate 101. A body contact 161 is self-aligned with the gate 160 and located in an isolation region 109. The body contact 161 couples the substrate 101 to one of the opposing sidewalls 108 of the body region 110. In one exemplary embodiment, the body contact 161 is a conductive sidewall member formed form epitaxial silicon growth.

For illustration purposes, and not by way of limitation, the device describe herein includes an n-channel metal oxide semiconductor field effect transistor (NMOS). Therefore, in this exemplary embodiment, the first and second source/drain regions, 105A and 105B respectively, include n+ type silicon material. The body region 110 includes p– type silicon material. The substrate similarly includes p– type silicon material and the body contact 161 includes p– type silicon material. One of ordinary skill in the art of semiconductor fabrication will understand the scope of the present invention encompasses a p-channel metal oxide semiconductor field effect transistor (PMOS). In the PMOS embodiment, the doping types in the respective semiconductor components are reversed.

Figure 1B:
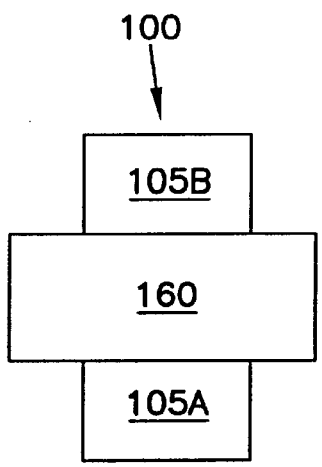
FIG. 1B is a top view of an embodiment of the silicon on insulator device shown in FIG. 1A.

FIG. 1B is a top view of an embodiment of the silicon on insulator device 100 shown in FIG. 1A. FIG. 1B illustrates the gate 160 located above the single crystalline semiconductor structure 103 and between the first and second source/drain regions, 105A and 105B respectively. The single crystalline semiconductor structure 103 constitutes the active area region and the isolation regions 109 are presented bordering both sides of the single crystalline semiconductor structure 103.

Figure 1C:
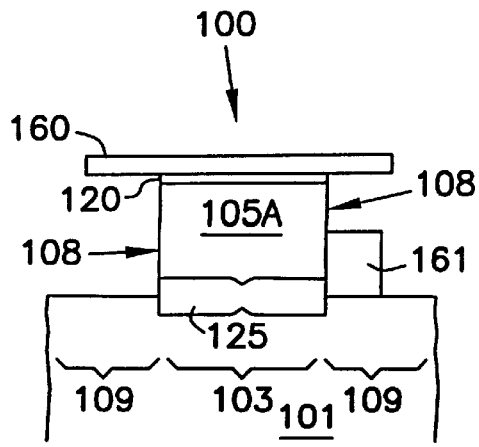
FIG. 1C is an end view of an embodiment of the silicon on insulator device shown in FIG. 1A.

FIG. 1C is an end view of an embodiment of the silicon on insulator device 100 shown in FIG. 1A. FIG. 1C illustrates the single crystalline semiconductor structure 103 formed on an insulator layer 125 formed on the substrate 101. Gate 160 is provided above the single crystalline semiconductor structure 103. The gate 160 is separated from the upper surface 104 of the crystalline semiconductor structure 103 by gate oxide 120. Body contact 161 is illustrated coupling the substrate 101 to one of the opposing sidewalls of the crystalline semiconductor structure 103 in an isolation region 109 of the device 100.

Figure 2A:
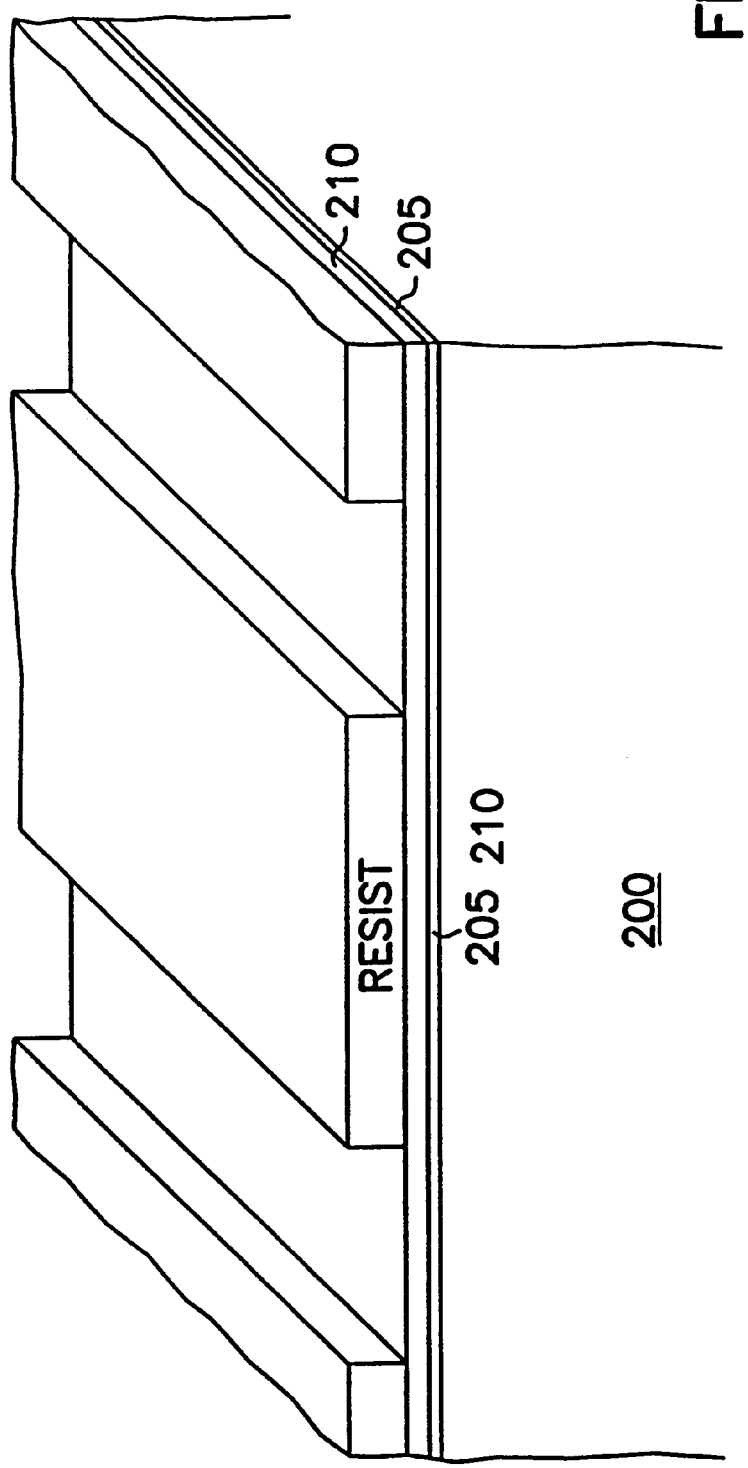

FIGS. 2A–2I illustrate an embodiment of the various processing steps for fabricating the silicon on insulator device. In the embodiment of FIG. 2A, the starting substrate 200 is p− silicon material. A thin silicon dioxide ($SiO_2$) layer 205 is formed on the substrate 200 using any suitable technique, e.g. thermal oxidation. A silicon nitride ($Si_3N_4$) layer 210 is formed on the silicon dioxide layer 205 such as by chemical vapor deposition (CVD). The silicon nitride layer 210 and the silicon dioxide layer 205 are formed to a combined thickness of approximately 60 nanometers (nm). A photoresist is applied and selectively exposed to define a striped mask. The structure is now as shown in FIG. 2A.

FIG. 2B illustrates the structure following the next sequence of process steps. The unmasked nitride layer 210, silicon dioxide layer 205, and the underlying substrate 200 are etched to form trenches 212. The trenches 212 are formed to a depth of approximately 0.2 micrometers ($\mu$m) below the desired active area region, e.g. a depth of approximately 0.4 $\mu$m into the substrate 200. The photoresist is removed, such as by conventional photoresist stripping techniques. Next, oxide 220 is deposited to fill trenches 212 to the surface of the nitride layer 210 and then the working surface is planarized, such as by chemical mechanical polishing/planarization (CMP). The structure is now as appears in FIG. 2B.

Figure 2C:
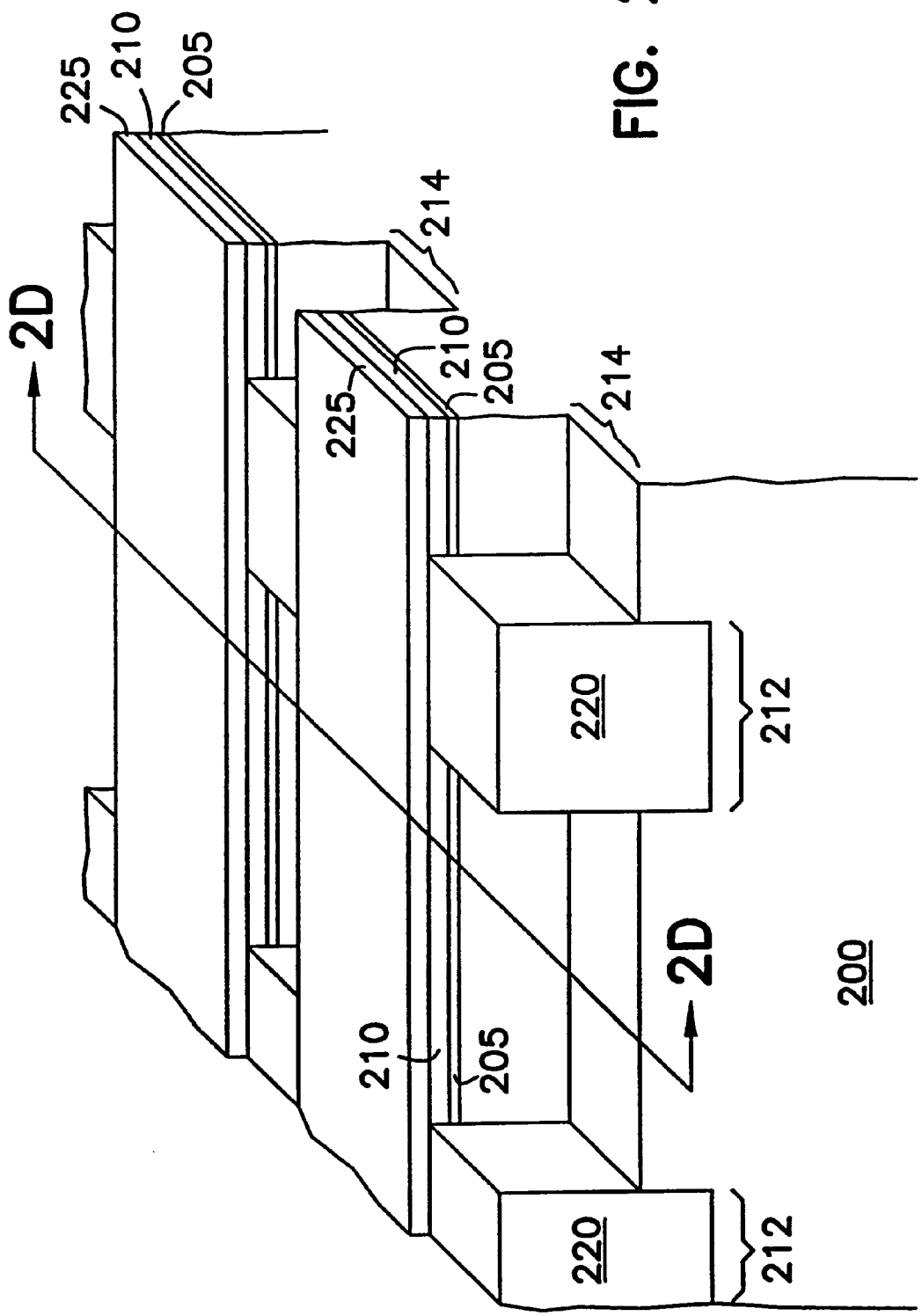

FIG. 2C illustrates the structure after the next sequence of process steps. A second nitride layer 225 is deposited such as, for example, by CVD. A photoresist is applied and exposed to define a stripped pattern orthogonal to the trenches 212 formed in the first photoresist application. The exposed nitride layer 225 and the underlying substrate 200 are selectively etched using any suitable technique such as, for example, reactive ion etching (RIE). The etching forms trenches 214. The substrate 200 is etched to a depth of approximately 50 nm below the desired active area region. Then the photoresist is removed using conventional photoresist stripping techniques. The structure is now as appears in FIG. 2C.

Figure 2D:
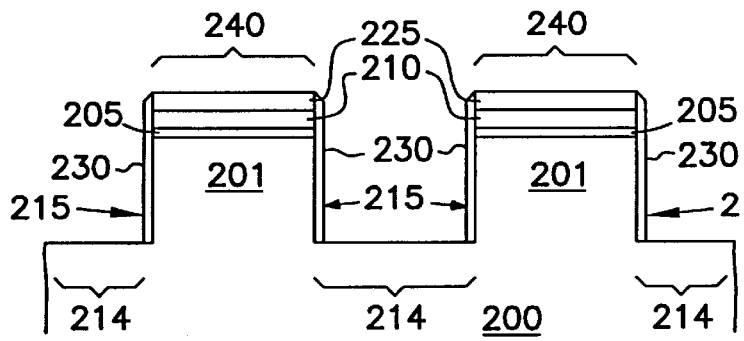

FIG. 2D illustrates the structure after the next series of process steps. FIG. 2D is a cross sectional view taken along cut line 2D—2D of FIG. 2C. The cross sectional view of FIG. 2D illustrates the silicon islands 240 formed in the previous etching step. Next, a thin nitride layer 230 is deposited in the trenches 214 such as by CVD. The nitride layer 230 is formed to a thickness of approximate 20 nm. The nitride layer 230 is then directionally etched to leave only on the vertical sidewalls 215 of the silicon islands 240. The structure is now as appears in FIG. 2D.

Figure 2E:
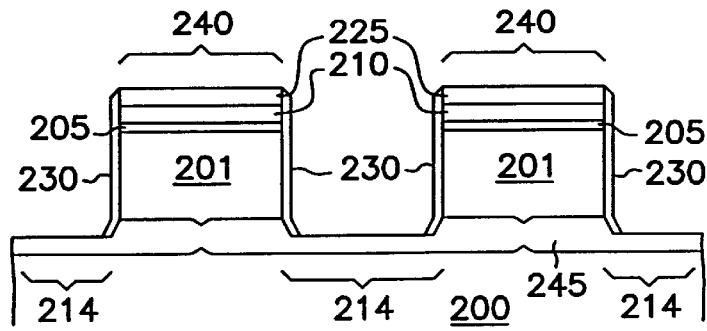

FIG. 2E illustrates the structure following the next sequence of process steps. Using the nitride layer 225 as a mask the exposed silicon at the base of the silicon islands 240 is isotropically etched to completely undercut the silicon islands 240. An oxide layer 245, or insulator layer 245, is formed such as by thermal oxidation in order to fill the gap formed between the silicon islands 240 and the substrate 200. This preceding step forms vertical silicon structures 201 extending outwardly from the oxide layer 245. For reference, oxide layer 245 can be formed using, for example, the techniques of U.S. application Ser. No. 08/745,708, entitled Silicon-On-Insulator Islands and Method for Their Formation (the '708 Application), or U.S. Pat. No. 5,691,230, entitled Technique for Producing Small Islands of Silicon on Insulator (the '230 Patent). The '708 Application and the '230 Patent are incorporated by reference. The structure is now as shown in FIG. 2E.

Figure 2F:
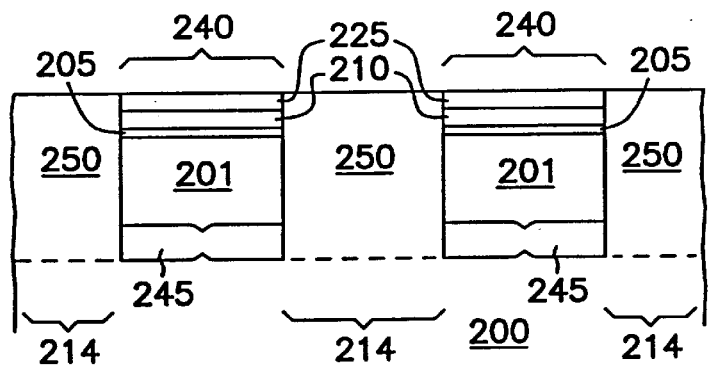

FIG. 2F illustrates the structure following the next series of processing steps. Oxide layer 245 is further directionally and selectively etched, such as by RIE, to remove the oxide layer 245 from the bottom of trenches 214 along side of the silicon islands 240. Next, the nitride layer 230 is stripped from the vertical sidewalls 215 of the silicon islands 240. The nitride layer 230 is stripped using any suitable technique such as RIE. A p− body contact 250 is next formed by ion-implantation of boron into the bottom of trenches 214 and epitaxial growth of p-silicon material. The epitaxial growth of the body contact 250 is continued until the trenches 214 are filled. The body contact connects the substrate 200 to the vertical silicon structures 201. The structure is now as appears in FIG. 2F.

Figure 2G:
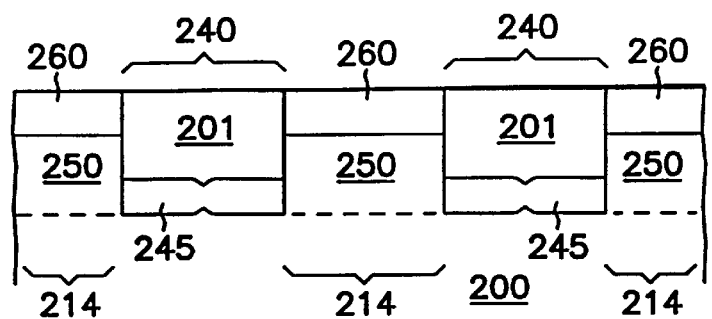

FIG. 2G shows the structure after the next series of process steps. The body contact 250 is etched back in the trenches 214 to a level approximately 0.1 $\mu$m below the top of vertical silicon structures 201. The body contacts 250 can be etched back using any suitable technique such as, for example, RIE. A nitride layer 260 is deposited in the trenches 214 above the body contacts 250. The nitride layer 260 is deposited such as by CVD and then planarized by CMP. Each of the respective nitride layers, 260, 225 and 210 respectively, are etched back to sufficiently expose the thin silicon dioxide layer 205 on the surface of the vertical silicon structures 201. The etch is again performed using any suitable method such as RIE. Next, the silicon dioxide layer 205 is removed using a wet etch process, e.g. a buffered oxide etch (BOE) technique. The structure is now as appears in FIG. 2G.

Figure 2H:
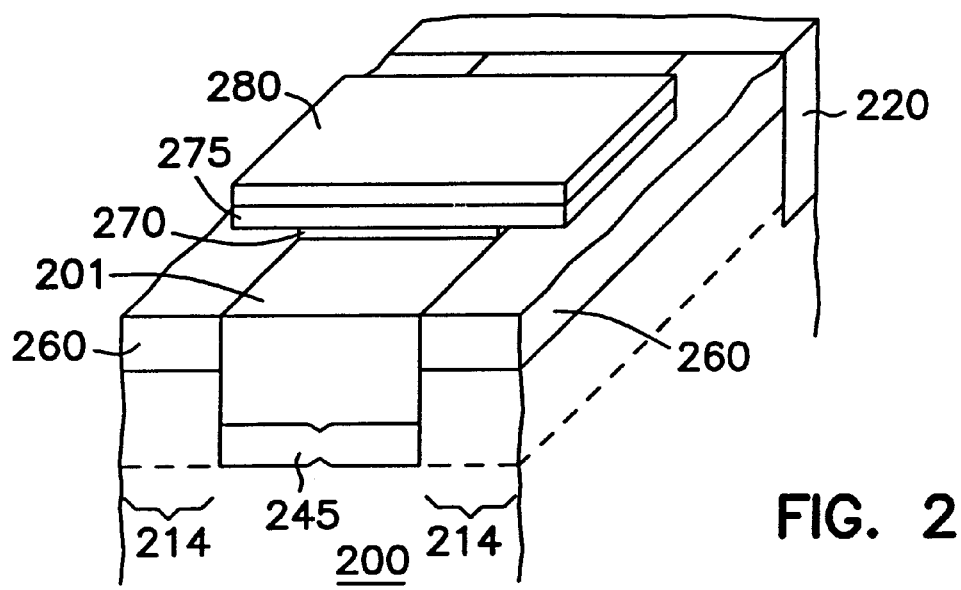

FIG. 2H provides a perspective view of the structure following the next series of process steps. A gate oxide 270 is grown on the exposed vertical silicon structures 201, such as by thermal oxidation. A polysilicon layer 275 is deposited across the gate oxide 270 and the nitride layer 260 in the trenches 214. The polysilicon layer is deposited through the use of any suitable method such as CVD. The polysilicon layer 275 is capped with an oxide layer 280. The oxide layer 280 is deposited using any suitable technique such as CVD. A photoresist is applied and exposed to define a mask pattern for a desired gate structure out of the polysilicon layer 275. The desired gate structure created by the mask extends beyond the area occupied by the the vertical silicon structures 201 and covers portions of the nitride layer 260. Next, the unmasked portions of the oxide layer 280 and the polysilicon layer 275 are removed. The oxide layer 280 and the polysilicon layer are removed using any suitable etching technique, e.g. RIE. The photoresist is then stripped using conventional photoresist stripping techniques. The structure is now as appears in FIG. 2H.

Figure 2I:
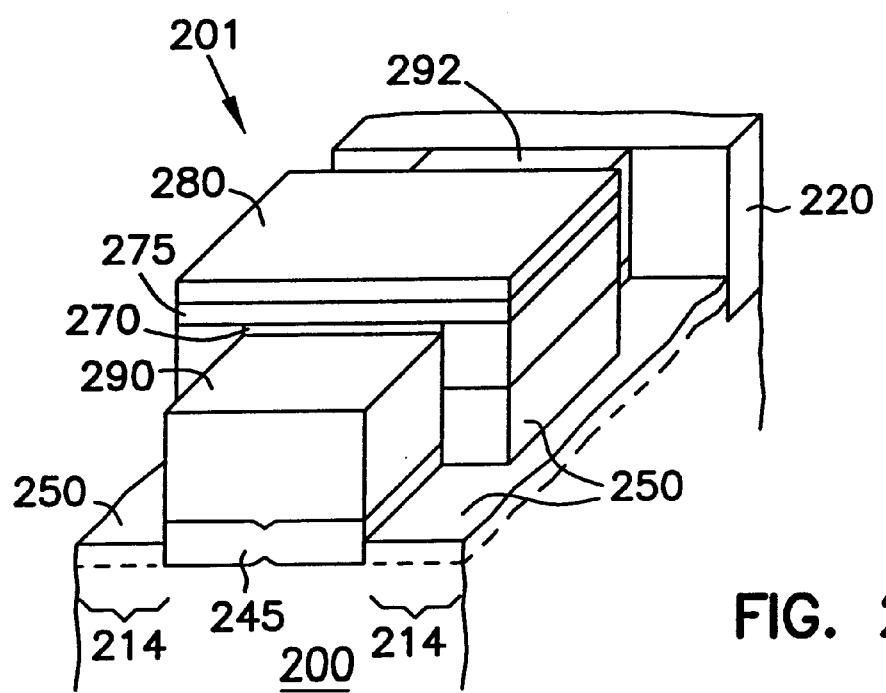

After the final series of process steps, the structure appears as shown in FIG. 2I. An oxide layer is deposited such as by CVD. A photoresist is applied and exposed to define a mask. The oxide layer is then etched to form gate edge spacers as will be understood by one of ordinary skill in the art of very large scale integrated circuit (VLSI) fabrication. The thickness of the gate edge spacers is determined by the desired drain engineering requirements. A source region 290 and a drain region 292 are provided by implanting ion dopants into the top of the exposed vertical silicon structures 201. The ion implantation uses conventional ion implanting techniques. In one embodiment, the source and drain regions, 290 and 292 respectively, comprise phosphorous doped, n+ silicon material. The gate behaves as an implant mask and provides for self-aligned source and drain regions, 290 and 292 respectively. Next, a high temperature rapid thermal anneal (RTA) is conducted. The anneal forms an oxide layer to protect the source and drain regions, 290 and 292 respectively, and activates the implanted dopant ions. As one skilled in the art will appreciate, the anneal simultaneously cures out the crystal damage induced by the previous ion implantation process. A selective nitride etch is performed using any suitable technique such as, for example, RIE. The etch removes the remaining nitride layer 260 except where masked by the polysilicon gate pattern 275. A selective silicon etch is performed by, for example, RIE to remove the exposed p– body contact 250 material except where masked by the polysilicon gate pattern 275. The etch is performed to a depth sufficient to reach below the vertical silicon structures 201. The structure is now as appears in FIG. 21.

For illustration purposes, and not by way of limitation, the fabrication steps presented above are directed toward fabricating an n-channel metal oxide semiconductor field effect transistor (NMOS). One of ordinary skill in the art of semiconductor fabrication will understand the scope of the present invention encompasses fabrication steps directed for forming a p-channel metal oxide semiconductor field effect transistor (PMOS). In the PMOS embodiment, the doping types and starting substrate type listed in the above semiconductor fabrication process are reversed.

The completed device can further be connected to any suitable integrated circuit by means of electrical contacts and metallization layers. One skilled in the art will recognize the method to these steps and, hence, they are not disclosed as part of this application.

Conclusion

An improved method and structure for a silicon on insulator (SOI) device are provided. The method and structure include a body contact that is formed from epitaxial growth between the substrate and the body region of the device. The body contact is self-aligned with the gate in an isolation region and therefore does not increase parasitic capacitance in the device. The structure conserves surface space on the semiconductor die and maximizes device density while preserving the performance benefits of the SOI structure. Transistors formed from this design can be used in a variety of beneficial applications, including both logic and memory circuits.

It is to be understood that the above description is intended to be illustrative, and not restrictive. Combinations of the above embodiments, and other embodiments will be apparent to those of skill in the art upon reviewing the above description. The above structures and fabrication methods have been described, by way of example, and not by way of limitation, with respect to the SOI devices and transistors. However, the scope of the invention includes any other integrated circuit applications in which the above structures and fabrication methods are used. Thus, the scope of the invention is not limited to the particular embodiments shown and described herein. The scope of the invention should be determined with reference to the appended claims, along with the full scope of equivalents to which such claims are entitled.

What is claimed is:

1. A method of fabricating a silicon on insulator (SOI) device, the method comprising:

forming a single crystalline semiconductor structure having an upper surface, wherein the structure includes a first source/drain region, a body region having opposing sidewalls, and a second source/drain region, and wherein the structure is formed on an insulator layer on a substrate;

forming a gate above the single crystalline semiconductor structure, wherein the gate extends beyond portions of the single crystalline semiconductor structure to cover portions of an isolation region; and forming a body contact, wherein the body contact couples the substrate to one of the opposing sidewalls of the body region, and wherein forming the body contact includes removing an exposed portion of the body contact using the gate as an etch mask.

2. The method of claim 1, wherein forming the body contact includes forming the body contact by epitaxial growth.

3. The method of claim 1, wherein forming the body contact includes forming the body contact in the isolation region.

4. The method of claim 1, wherein forming the body region includes forming the body region from n– silicon material, and wherein forming the body contact includes forming the body contact from n– silicon material.

5. The method of claim 1, wherein forming the body region includes forming the body region from p– silicon material, and wherein forming the body contact includes forming the body contact from p– silicon material.

6. A method of forming a body contacted transistor on an insulator layer, comprising:

forming an active region of the transistor, the active region including first source/drain region, a second source/drain region, and a body region;

forming a gate located above the body region and between the first and second source/drain region; and forming a body contact, wherein the body contact is coupled to a substrate in an isolation region, wherein the body contact is coupled to the body region, and wherein forming the body contact includes using the gate as an etch mask.

7. The method of claim 6, wherein forming the body contact includes forming the body contact self-aligned with the gate.

8. The method of claim 6, wherein forming the body contact includes forming the body contact by epitaxial growth.

9. The method of claim 6, wherein forming the body region includes forming the body region from p– silicon material, and wherein forming the body contact includes forming the body contact from p– silicon material.

10. The method of claim 6, wherein forming the body region includes forming the body region from n– silicon material, and wherein forming the body contact includes forming the body contact from n– silicon material.

11. A method of forming a body contacted transistor, comprising:

forming an active region of the transistor, the active region including first source/drain region, a second source/drain region, and a body region;

forming a gate located above the body region and between the first and second source/drain region;

epitaxially growing a body contact in an isolation region such that the body contact couples a substrate to the body region; and removing exposed portions of the body contact using the gate as an etch mask.

12. A method of fabricating a silicon on insulator (SOI) device on a substrate, the method comprising:

forming a transistor having a source, a drain, and a body, wherein the body includes opposing sidewalls;

forming a gate above an upper surface of the body, wherein the gate extends beyond portions of the body to cover portions of an isolation region; and forming a body contact in the isolation region, wherein the body contact couples the substrate to one of the opposing sidewalls of the body, and wherein forming the body contact includes using the gate as an etch mask.

* * * * *

UNITED STATES PATENT AND TRADEMARK OFFICE
CERTIFICATE OF CORRECTION

PATENT NO.: 6,156,589

DATED: Dec. 5, 2000

INVENTOR(S) : Noble

It is certified that error appears in the above-identified patent and that said Letters Patent is hereby corrected as shown below:

Title page, item [57],
In the abstract, line 8, delete "not does" and insert --nor does--, therefor.

Signed and Sealed this

First Day of May, 2001

Attest:

NICHOLAS P. GODICI

Attesting Officer

Acting Director of the United States Patent and Trademark Office